(12) United States Patent
Bender et al.

(10) Patent No.: US 8,806,315 B2
(45) Date of Patent: Aug. 12, 2014

(54) CHECKSUM CALCULATION, PREDICTION AND VALIDATION

(71) Applicant: International Business Machines Corporation, Armonk, NY (US)

(72) Inventors: Carl A. Bender, Highland, NY (US); Michael J. Cadigan, Jr., Poughkeepsie, NY (US); Nihad Hadzic, Poughkeepsie, NY (US); Howard M Haynie, Wappingers Falls, NY (US); Jeffrey M. Turner, Poughkeepsie, NY (US); Raymond Wong, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/068,347

(22) Filed: Oct. 31, 2013

(65) Prior Publication Data

US 2014/0047307 A1 Feb. 13, 2014

Related U.S. Application Data

(63) Continuation of application No. 13/117,294, filed on May 27, 2011.

(51) Int. Cl.
*G06F 11/00* (2006.01)
(52) U.S. Cl.
USPC ........................................... 714/799; 714/776
(58) Field of Classification Search
CPC ..... H04L 69/22; G06F 11/1104; G06F 11/16; H03M 13/096

USPC ............. 709/212; 710/52; 714/807, 758, 776, 714/799, 781; 370/392
See application file for complete search history.

(56) References Cited

U.S. PATENT DOCUMENTS

| 5,522,039 | A | 5/1996 | Snyder et al. |
| 6,088,676 | A | 7/2000 | White, Jr. |
| 6,279,140 | B1 | 8/2001 | Slane |
| 6,530,061 | B1* | 3/2003 | Labatte .................... 714/807 |
| 6,654,823 | B2 | 11/2003 | Soejima et al. |
| 6,728,929 | B1 | 4/2004 | Luong |
| 6,964,008 | B1 | 11/2005 | Van Meter, III |

(Continued)

FOREIGN PATENT DOCUMENTS

| EP | 0421693 A2 | 4/1991 |
| EP | 0632386 A3 | 12/1996 |

(Continued)

OTHER PUBLICATIONS

International Search Report and Written Opinion for International Application No. PCT/IB2012/052603, International Filing Date May 24, 2012, 12 pgs.

(Continued)

*Primary Examiner* — David Ton
(74) *Attorney, Agent, or Firm* — Cantor Colburn LLP; Steven Chiu

(57) ABSTRACT

A calculation, prediction and validation method can include receiving a portion of a data packet in a data buffer, computing, in a processor, information related to the checksum of the data packet based on the portion of the data packet and processing the data packet in the processor.

9 Claims, 7 Drawing Sheets

(56) References Cited

U.S. PATENT DOCUMENTS

| | | |
|---|---|---|
| 7,134,070 B2 | 11/2006 | Thakur et al. |
| 7,181,675 B2 | 2/2007 | Mantog |
| 7,283,528 B1 * | 10/2007 | Lim et al. ............ 370/392 |
| 7,779,330 B1 * | 8/2010 | Cocos ................. 714/758 |
| 7,958,436 B2 * | 6/2011 | King et al. ........... 714/781 |
| 8,225,188 B2 * | 7/2012 | Basso et al. .......... 714/807 |
| 2002/0026620 A1 | 2/2002 | Johansson et al. |
| 2004/0163025 A1 | 8/2004 | Lakaniemi |
| 2009/0097486 A1 | 4/2009 | Carlini et al. |
| 2010/0161750 A1 | 6/2010 | Pandya |

FOREIGN PATENT DOCUMENTS

| | | |
|---|---|---|
| EP | 0585435 B1 | 12/2000 |
| EP | 1826693 A1 | 8/2007 |
| EP | 1865430 A2 | 12/2007 |
| WO | 2009149895 A1 | 12/2009 |

OTHER PUBLICATIONS

Final Office Action for U.S. Appl. No. 13/117,294, mailed Aug. 29, 2013, 11 pages.

Non Final Office Action for U.S. Appl. No. 13/117,294, mailed Mar. 27, 2013, 9 pages.

* cited by examiner

CHECKSUM CALCULATION, PREDICTION AND VALIDATION

CROSS-REFERENCE TO RELATED APPLICATION

This application is a continuation of U.S. patent application Ser. No. 13/117,294, filed May 27, 2011, the disclosure of which is incorporated by reference herein in its entirety.

BACKGROUND

The present invention relates to network protocols, and more specifically, to checksum calculation, prediction and validation in network protocols.

Checksums are used by the Internet Protocol (IP), Transmission Control Protocol (TCP) and User Datagram Protocol (UDP), among others, for header and payload validation of data transferred across Ethernet networks. The data which each checksum covers is rigidly defined for each protocol, however given the "left to right", or serial data stream, nature of Ethernet networks checksums are typically calculated in a linear fashion. This relies on having a complete or steady supply of data available at the time of computation. Furthermore, the process of checksum computation requires a significant amount of processing time and lends itself to being done in a hardware accelerator. Large send is another checksum feature whereby the host processor offloads TCP segmentation to a hardware engine or co-processor. A problem with this linear approach arises when data pieces arrive out of order or at different stages of processing, are stored in disjoint memory locations, or any other scenario where a complete and steady data throughput is not sustainable, all of which are often encountered in hardware accelerator Ethernet implementations.

SUMMARY

Exemplary embodiments include a checksum calculation and validation method. The method can include receiving a portion of a data packet in a data buffer, computing, in a processor, information related to the checksum of the data packet based on the portion of the data packet and processing the data packet in the processor.

Additional exemplary embodiments include a checksum calculation and validation method. The method can include receiving headers for a data packet in a reception data buffer, computing the expected full checksum for the data packet in a processor based on the received headers, receiving an actual checksum for the data packet in the reception data buffer and comparing the expected full checksum to the actual checksum for the data packet.

Additional exemplary embodiments include a checksum calculation and validation method. The method can include receiving headers for a data packet in a transmission data buffer, computing factors related to the headers in a processor, receiving an actual checksum for the data packet in the reception data buffer, subtracting irrelevant factors from the data packet and inserting the actual checksum into the data packet.

Further exemplary embodiments include a checksum calculation and validation system. The system can include a host system, a network interface, a reception pipeline disposed between the host system and network interface and configured to calculate an expected full checksum related to packets received in the host system and a transmission pipeline disposed between the host system and network interface and configured calculate factors related to packets for transmission on the network interface.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

In exemplary embodiments, the systems and methods described herein calculate checksums over bulk data (i.e., a full or bulk checksum), and include provisions to factor out irrelevant data (i.e., factors) where appropriate. The foundation of this method relies on exploiting the commutative property of checksums to use the data available to predict a bulk checksum suitable for comparison. As such, calculating checksums over bulk data can be performed as disjoint operations and separate times. In this way, the full checksum can be predicted and is suitable for comparison before the data is ready. The data pipeline can keep flowing in this manner.

Figure 1:
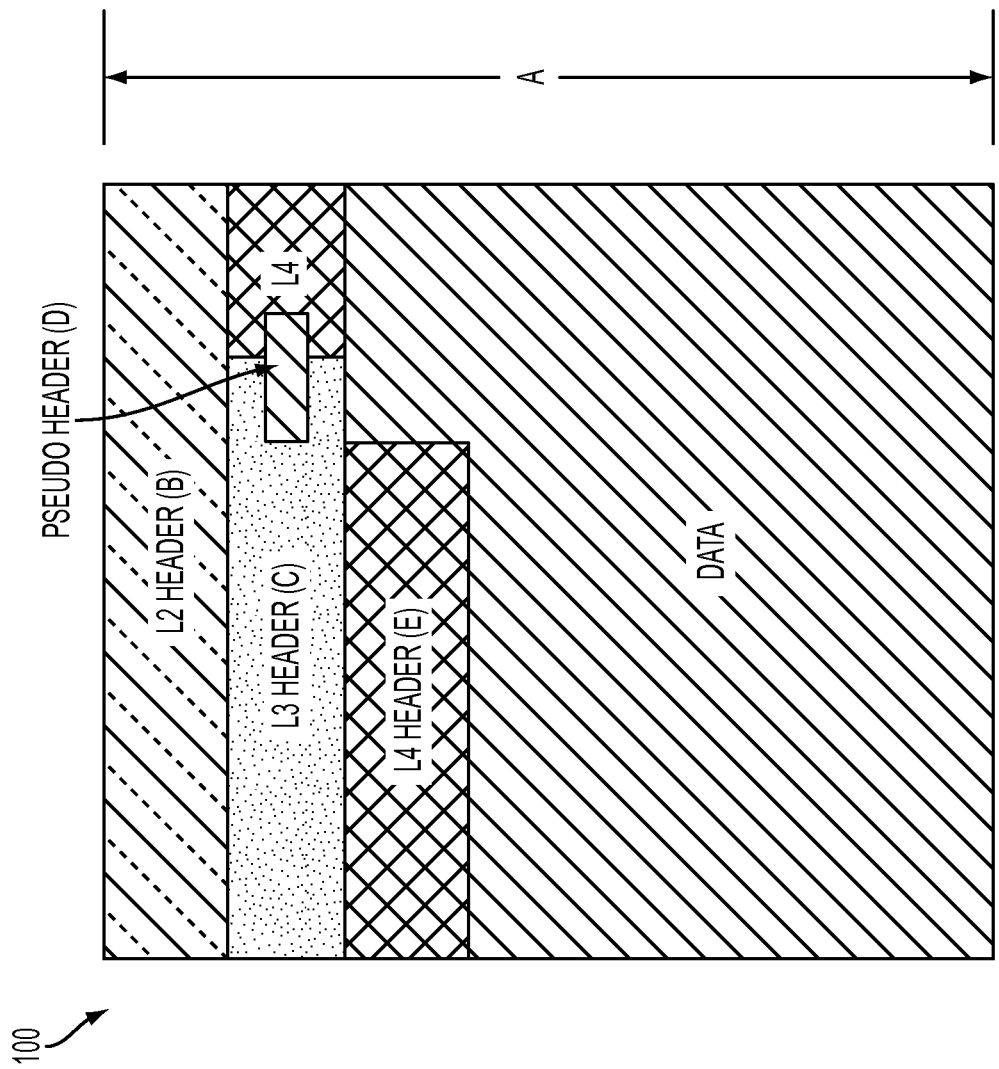
FIG. 1 illustrates an example of a TCP/IP packet as received by or prepared and suitable for transmission over a network, with its major structures labeled.

FIG. 1 illustrates an example of a TCP/IP packet as received by or prepared and suitable for transmission over a network, with its major structures labeled. The TCP/IP packet 100 is shown for illustrative purposes. It will be appreciated that other protocols that implement checksum are contemplated in other exemplary embodiments. The packet 100 and its data are defined collectively as A. As known in the art, protocol packets such as the packet 100 can include multiple layers in their associated data headers. In the example illustrated in FIG. 1, the packet 100 includes a L2 layer header, B, a L3 layer header, C, a L4 layer header E, and a pseudo-header, D, which links the L3 layer header, C, and the L4 layer header E. The pseudo-header, D, is a data structure used in the computation of checksums only and is not an actual data field. Rather, pseudo-header, D, includes portions of data from the L3 layer header, C, and the L4 layer header, E. There are checksum fields within the L3 layer header, C, and L4 layer header, E, which is both extracted and computed, then compared, to validate successful data transmission. The remaining portion of the packet is the data. In exemplary embodiments, as further described herein, the entire packet checksum 100 can be represented as: A=B+C+E−D.

Figure 2:
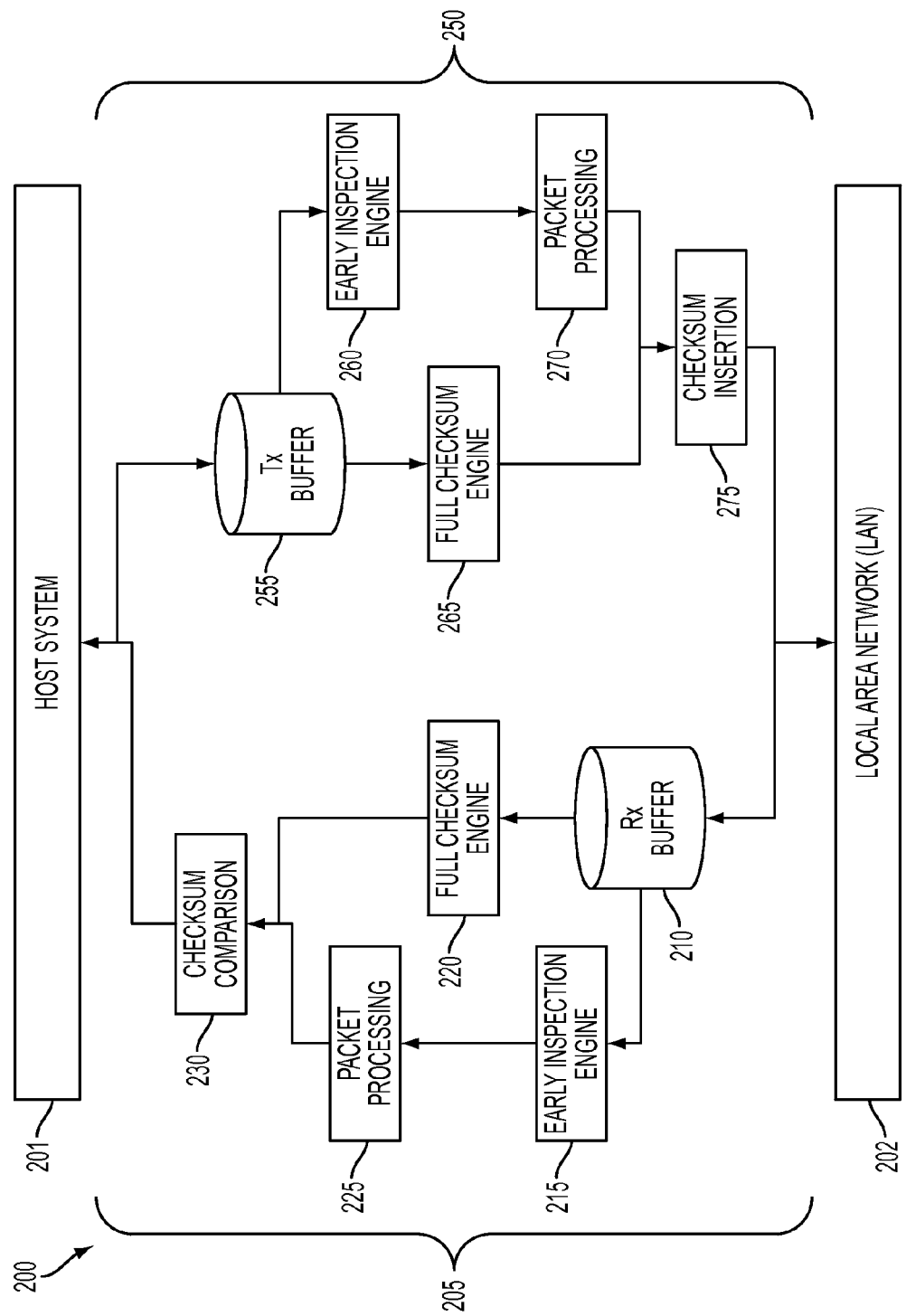
FIG. 2 illustrates a block diagram of an exemplary checksum calculation and validation system.

FIG. 2 illustrates a block diagram of an exemplary checksum calculation and validation system 200. In exemplary embodiments, the system 200 can include a host system 201, such as a computer system, in which packets such as the packet 100 can be received from or transmitted to a network such as a local area network (LAN) 202. In addition, the system 100 can include a reception pipeline 205 through which the packets can be processed and received in the host system 201 from the LAN 202. The system 100 can also include a transmission pipeline 250 through which the packets can be processed and transmitted from the host system 201 to the LAN 202.

In exemplary embodiments, the reception pipeline 205 can include a reception buffer 210 into which packets are received and buffered from the LAN 202. The reception pipeline 205 can further include an early inspection engine 215 operatively coupled to the reception buffer 210, which is logic that computes the checksum factors, which occurs early in the reception pipeline 205. The early inspection engine 215 extracts and computes the checksum for L2 layer header, B, a L3 layer header, C, and the L4 layer header E from the reception buffer 210. The reception pipeline 205 can further include a full checksum engine 220, which is the logic that continuously computes the bulk or full checksum of the packet 100. The full checksum engine 220 finishes processing once the packet 100 has been fully received in the reception buffer 210. As such, the full checksum engine 220 computes the checksum across the complete amount of data, A. The reception pipeline 205 further includes a checksum comparison logic 230 operatively coupled between packet processing logic 225 and the host system 201, and between the full checksum engine 220 and the host system 201. The checksum comparison logic 230 compares the checksum computed in the early inspection engine 215 and the checksum computed in the full checksum engine 220. As such, the checksum comparison logic 230 is a final check that validates the checksum contained in the L4 layer header E. As data is received from the LAN 202 in a linear fashion, the early inspection engine 215 is able to start once the headers have been successfully stored in local memory, such as the reception buffer 210. The entire packet 100 does not necessarily have to be received at this time. For example, the early inspection engine 215 is able to validate the L3 layer header, C, checksum at the time of its running, but it is not able to validate the L4 layer header, E, checksum. In exemplary embodiments, the system 200, via the reception pipeline 205 computes an expected "full" checksum, that is, a checksum across all of the data, A, in the full checksum engine 220. The reception pipeline 205 can further include the packet processing logic 225 that represents all other packet processing that occurs within the reception pipeline 205.

In exemplary embodiments, the transmission pipeline 250 can include a transmission data buffer 255 into which packets are transmitted and buffered from the host system 201 for ultimate transmission in the LAN 202. The transmission pipeline 250 can further include an early inspection engine 260 operatively coupled to the transmission data buffer 255, which is logic that computes the checksum factors, which occurs early in the transmission pipeline 250. The early inspection engine 260 inserts and computes the checksum for a L3 layer header, C, and the L4 layer header E for insertion into the transmission buffer 255. In this example, the L2 layer header, B, is an irrelevant factor as further described herein. The transmission pipeline 250 can further include a full checksum engine 265, which is the logic that continuously computes the bulk or full checksum of the packet 100. The full checksum engine 265 finishes processing once the packet 100 has been fully inserted into the transmission buffer 255. As such, the full checksum engine 265 computes the checksum across the complete amount of data, A. The transmission pipeline 250 further includes a checksum insertion logic 275 operatively coupled between packet processing logic 270 and the host system 201, and between the full checksum engine 265 and the host system 201. The L3 layer header, C, is calculated by the early inspection engine 260 and is inserted into the transmission data buffer 255. Irrelevant factors identified by the early inspection engine are subtracted from the full checksum via the full checksum engine to generate the L4 layer header, E, which is inserted into the packet 100. In exemplary embodiments, the system 200, via the transmission pipeline 250 computes a "full" checksum, that is, a checksum across all of the data, A, in the full checksum engine 265. The transmission pipeline 250 can further include the packet processing logic 270 that represents all other packet processing that occurs within the transmission pipeline 250.

Figure 3:
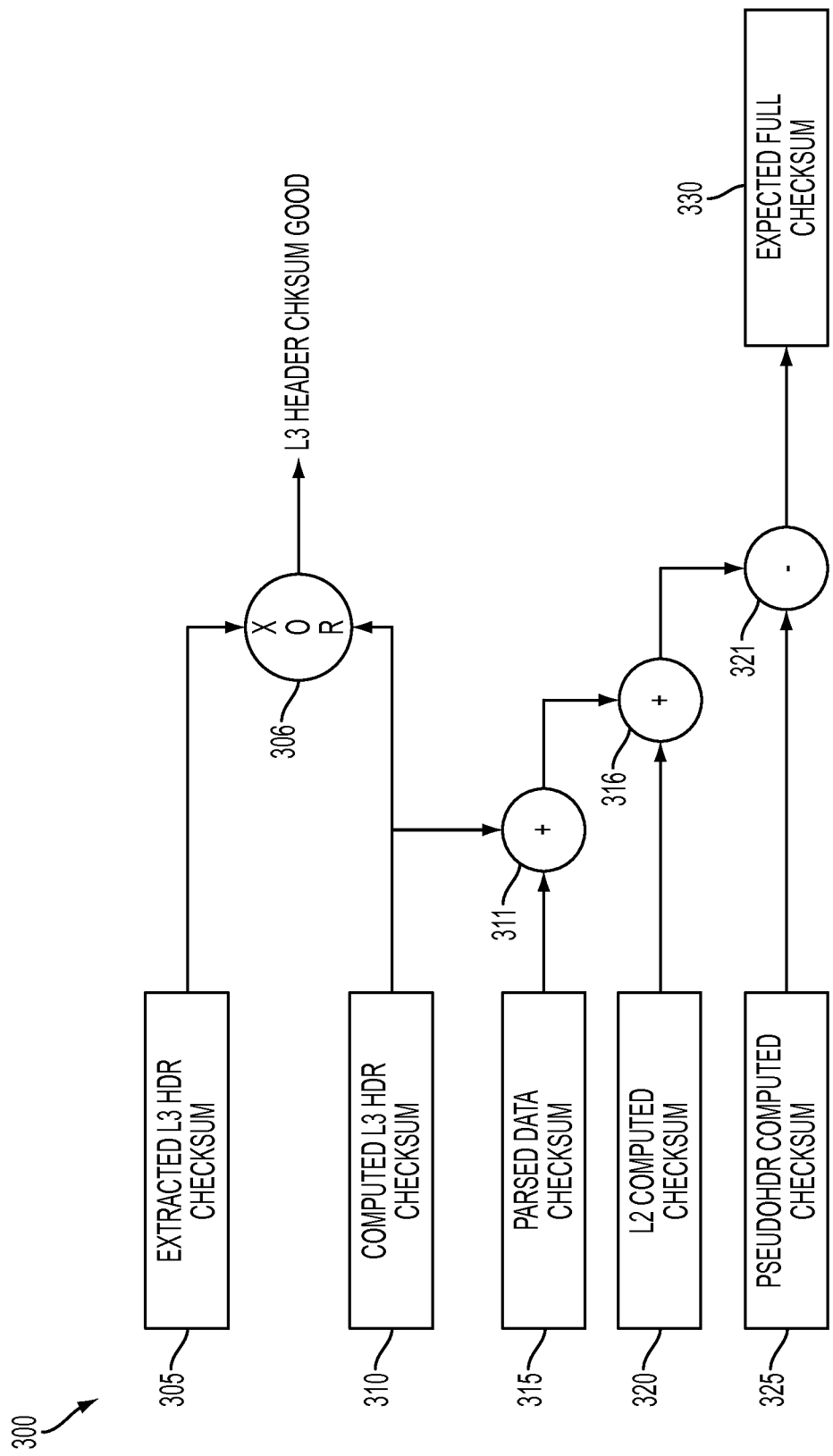
FIG. 3 diagrammatically illustrates a method for computing an expected full checksum for all data, in a reception pipeline, in accordance with exemplary embodiments.
Figure 4:
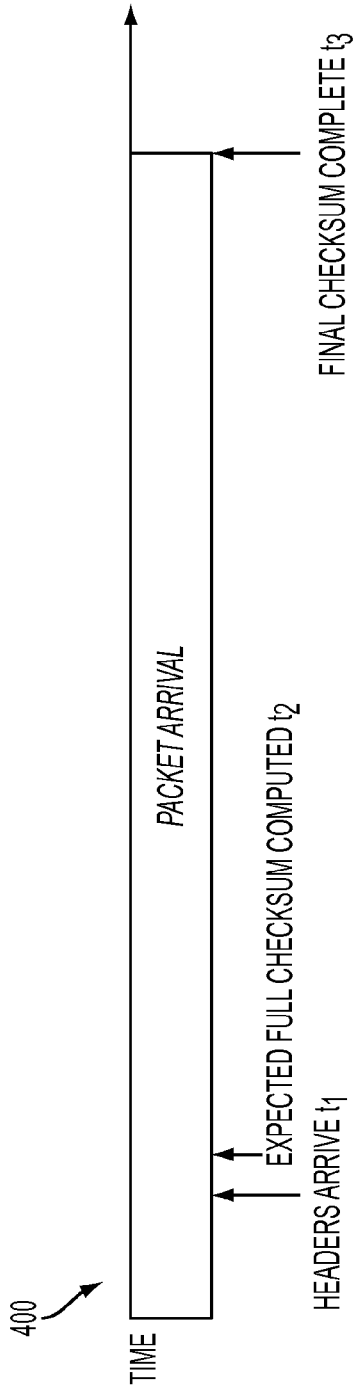
FIG. 4 illustrates an example of a timeline illustrating that the method of FIG. 3 proceeds when the headers first arrive.

FIG. 3 diagrammatically illustrates a method 300 for computing an expected full checksum for all data, A, in the reception pipeline 205, in accordance with exemplary embodiments. As described above, the computation for the full checksum of all data A, can be given as: A=B+C+E−D. Diagrammatically, block 305 represents the actual extracted checksum from the L3 layer header C. The block 310 represents the computed L3 layer header, C. An exclusive "or" is computed at block 306 to validate that the L3 layer header, C that was extracted matches the L3 layer header, C that was computed. At the same time, block 315 represents parsed data from the packet 100 that is added to the computed L3 layer header, C, at block 311. Block 320 represents a computed L2 layer header, B that is added to the sum from block 311 at block 316. Block 325 represents the pseudo-header, D that is subtracted from the sum from block 316, at block 321. The difference from block 321 is the expected full checksum at block 330. As such, the method 300 illustrates that upon receiving parts of the packet 100, the method 300 processes whatever parts of the packet 100 that is received in the reception pipeline 205 and begins to compute what the checksum is expected to be. The method 300 proceeds by extracting the different headers, comparing the extracted portions of the headers to computed headers, then subtracting out the pseudo-header portions. FIG. 4 illustrates an example of a timelines 400 illustrating that the method 300 proceeds when the headers first arrive at $t_1$. The expected full checksum is then computed at $t_2$, and the final checksum is complete at $t_3$. As such, expected checksum computation and header validation happens at the beginning of data arrival.

Figure 5:
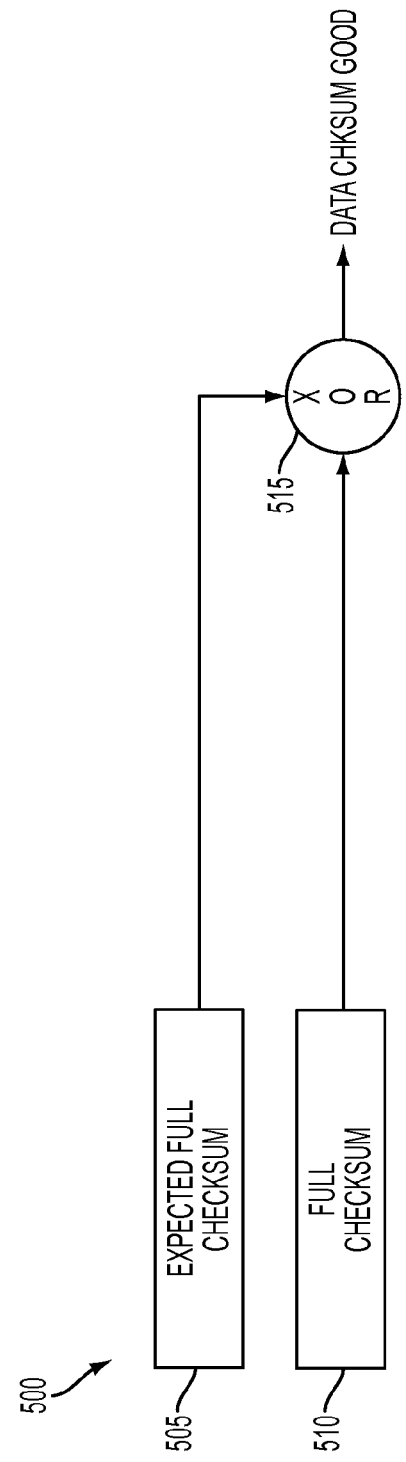
FIG. 5 diagrammatically illustrates a method for final comparison of an expected checksum and full checksum in accordance with exemplary embodiments.

FIG. 5 diagrammatically illustrates a method 500 for final comparison of an expected checksum and full checksum in accordance with exemplary embodiments. At block 515, the method 500 computes an exclusive "or" of the expected full checksum at block 505 and the full checksum at block 510 to determine if the data checksum is good. Final comparison occurs for inbound packets at the end of processing of the packets. In this way, the method 500 takes the checksum that comes with the packet and adds all of the components that should be present as previously predicted by computing the separate checksum header components as described herein. In this way, time savings are realized because processing begins on the packet 100 as soon as it begins to arrive.

The following reception example illustrates the method described in FIGS. 3-4. The expected full checksum includes the checksum of L3 layer header, C, and the checksum of L4 layer header, E, in the calculations. Therefore, the checksum accumulated over the entire L3 layer header, C, would always be x0000 (after ones complement) and the checksum accumulated of the entire data portion of the entire L4 layer header, E, would also be x0000 (after ones complement). The Expected Full Checksum formula essentially becomes the following: Expected Full Checksum=(L2 Checksum+ xFFFF+xFFFF−pseudo header checksum) xor xFFFF, or A=(B+xFFFF+xFFFF−D) xor xFFFF. As such, the output of the early inspection engine 215 operatively is the expected full checksum the data A. Once all of the data has been received, the full checksum engine 220 is complete and obtains a computed value for the data A. The final validation involves a comparison of expected data A against computed data A, as performed in the checksum comparison logic 230 as described herein.

Figure 6:
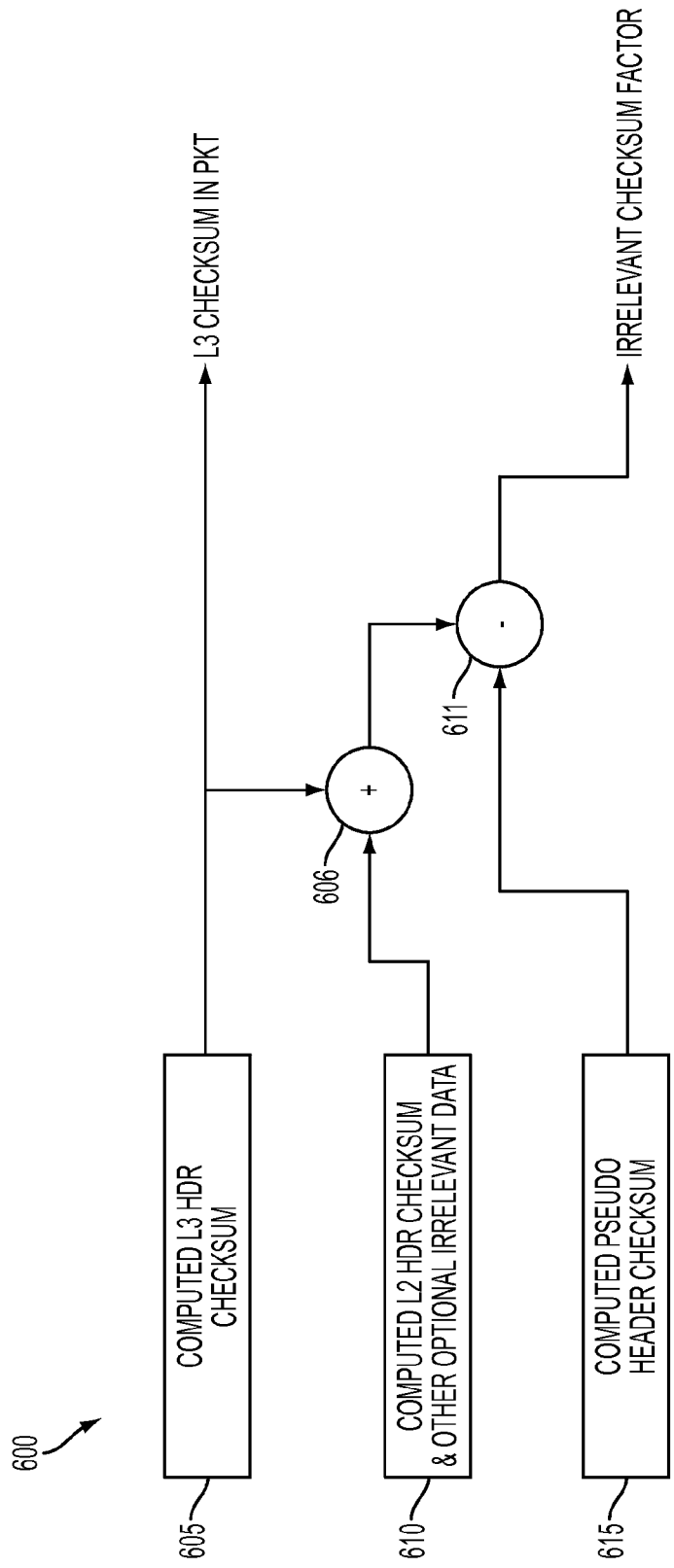
FIG. 6 diagrammatically illustrates a method for computing an expected full checksum for insertion into data, in a transmission pipeline, in accordance with exemplary embodiments.
Figure 7:
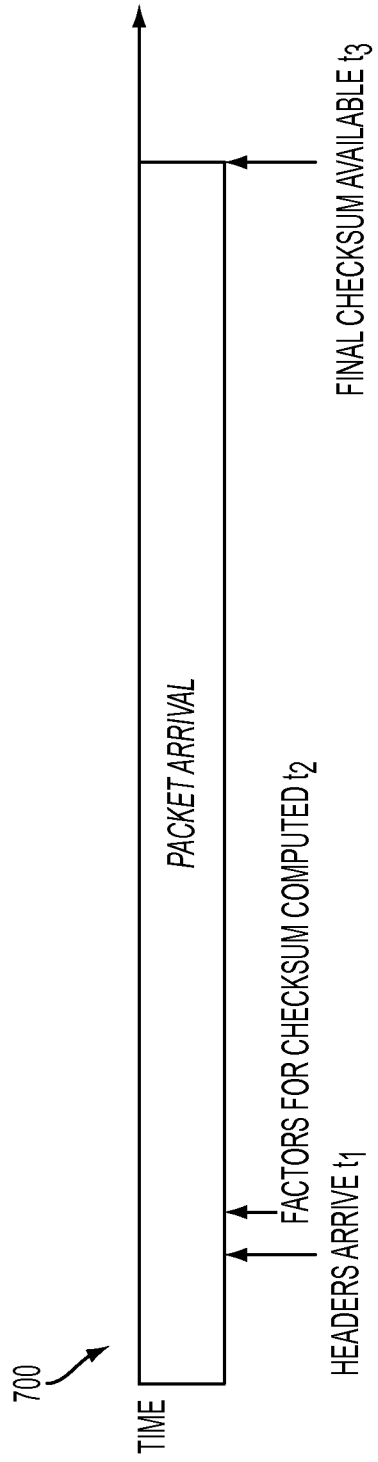
FIG. 7 illustrates an example of a timelines illustrating that the method of FIG. 6 proceeds when the headers first arrive.

FIG. 6 diagrammatically illustrates a method 600 for computing an expected full checksum for insertion into the data, A, in the transmission pipeline 250, in accordance with exemplary embodiments. As described above, the computation for the full checksum for insertion into the data, A, can be given as: E=A−(B+C−D). Diagrammatically, block 605 represents the computed checksum for the L3 layer header, C, which ends up being inserted into the data A. The block 610 represents the computed L2 layer header checksum, B that is added at block 606. The block 615 represents the pseudo-header, D that is subtracted from the sum from block 606, at block 611, and is the irrelevant checksum factor that is eventually discarded once the actual checksum is inserted and the full data packet is transmitted. As such, the method 600 illustrates that upon receiving parts of the packet 100, the method 600 processes whatever parts of the packet 100 that is transmitted in the transmission pipeline 250 and begins to compute what the checksum to be inserted into the data packet 100. The method 600 proceeds by computing the different header checksums, then subtracting out the irrelevant portions. FIG. 7 illustrates an example of a timelines 700 illustrating that the method 600 proceeds when the headers first arrive at $t_1$. The full checksum is then computed at $t_2$, and the final checksum is complete at $t_3$. As such, checksums are created and inserted into the headers.

Figure 8:
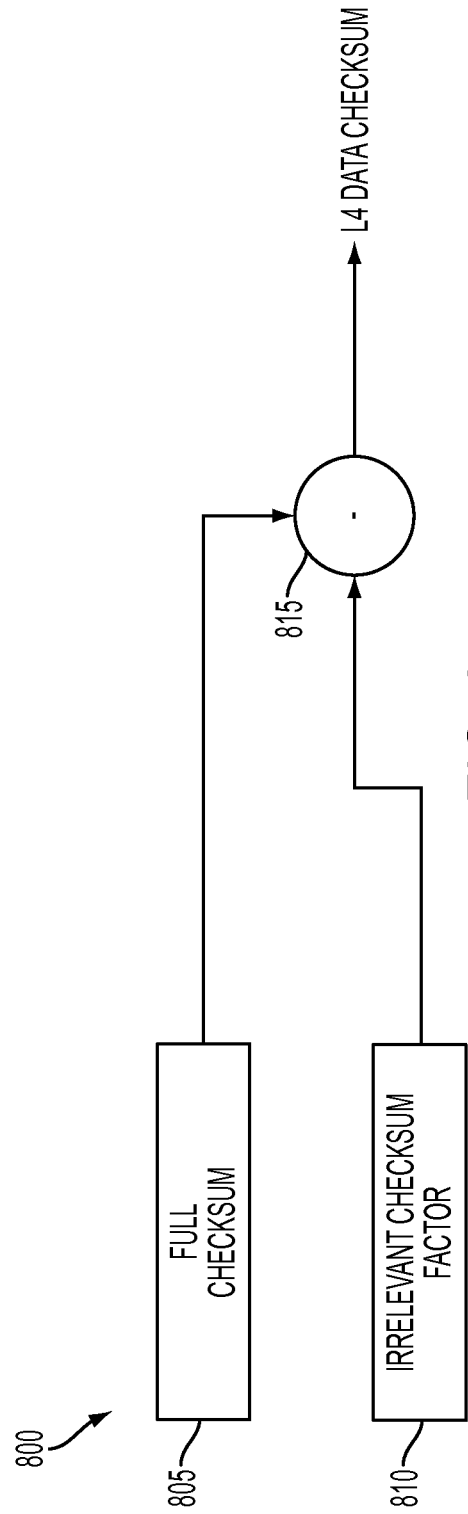
FIG. 8 diagrammatically illustrates a method for computation of an L4 data checksum in accordance with exemplary embodiments.

FIG. 8 diagrammatically illustrates a method for computation of an L4 data checksum in accordance with exemplary embodiments. At block 815, the method 800 subtracts the irrelevant checksum factors at block 810 from the full checksum at block 805 to determine the L4 layer header, E, that is inserted into the data packet 100 for transmission. In this way, the method 800 computes the final checksum in pieces as the headers become available from the host system 201. In this way, time savings are realized because processing begins on the packet 100 as soon as it is available for transmission.

Figure 9:
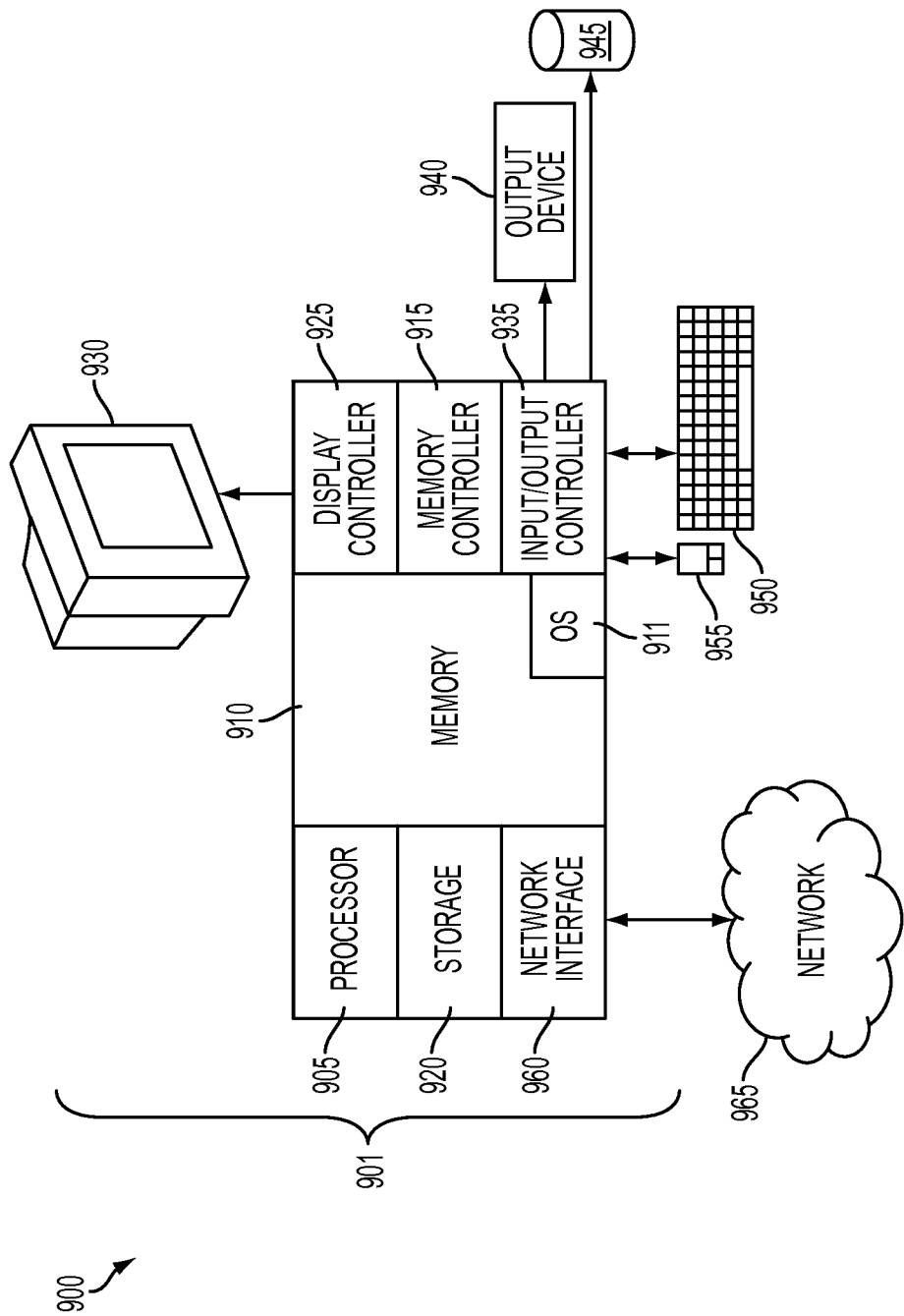
FIG. 9 illustrates an exemplary embodiment of a system for checksum calculation and validation illustrating further details of the system of FIG. 2.

FIG. 9 illustrates an exemplary embodiment of a system 900 for checksum calculation and validation illustrating further details of the system 200 of FIG. 2. The methods described herein can be implemented in software (e.g., firmware), hardware, or a combination thereof. In exemplary embodiments, the methods described herein are implemented in software, as an executable program, and is executed by a special or general-purpose digital computer, such as a personal computer, workstation, minicomputer, or mainframe computer. The system 900 therefore includes general-purpose computer 901.

In exemplary embodiments, in terms of hardware architecture, as shown in FIG. 9, the computer 901 includes a processor 905, memory 910 coupled to a memory controller 915, and one or more input and/or output (I/O) devices 940, 945 (or peripherals) that are communicatively coupled via a local input/output controller 935. The input/output controller 935 can be, but is not limited to, one or more buses or other wired or wireless connections, as is known in the art. The input/output controller 935 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 905 is a hardware device for executing software, particularly that stored in memory 910. The processor 905 can be any custom made or commercially available processor, a central processing unit (CPU), an auxiliary processor among several processors associated with the computer 901, a semiconductor based microprocessor (in the form of a microchip or chip set), a macroprocessor, or generally any device for executing software instructions.

The memory 910 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 910 may incorporate electronic, magnetic, optical, and/or other types of storage media. Note that the memory 910 can have a distributed architecture, where various components are situated remote from one another, but can be accessed by the processor 905.

The software in memory 910 may include one or more separate programs, each of which comprises an ordered listing of executable instructions for implementing logical functions. In the example of FIG. 9, the software in the memory 910 includes the checksum calculation and validation methods described herein in accordance with exemplary embodiments and a suitable operating system (OS) 911. The OS 911 essentially controls the execution of other computer programs, such the checksum calculation and validation systems and methods as described herein, and provides scheduling, input-output control, file and data management, memory management, and communication control and related services.

The checksum calculation and validation methods described herein may be in the form of a source program, executable program (object code), script, or any other entity comprising a set of instructions to be performed. When a source program, then the program needs to be translated via a compiler, assembler, interpreter, or the like, which may or may not be included within the memory 910, so as to operate properly in connection with the OS 911. Furthermore, the checksum calculation and validation methods can be written as an object oriented programming language, which has classes of data and methods, or a procedure programming language, which has routines, subroutines, and/or functions.

In exemplary embodiments, a conventional keyboard 950 and mouse 955 can be coupled to the input/output controller 935. Other output devices such as the I/O devices 940, 945 may include input devices, for example but not limited to a printer, a scanner, microphone, and the like. Finally, the I/O devices 940, 945 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. The system 900 can further include a display controller 925 coupled to a display 930. In exemplary embodiments, the system 900 can further include a network interface 960 for coupling to a network 965. The network 965 can be an IP-based network for communication between the computer 901 and any external server, client and the like via a broadband connection. The network 965 transmits and receives data between the computer 901 and external systems. In exemplary embodiments, network 965 can be a managed IP network administered by a service provider. The network 965 may be implemented in a wireless fashion, e.g., using wireless protocols and technologies, such as WiFi, WiMax, etc. The network 965 can also be a packet-switched network such as a local area network, wide area network, metropolitan area network, Internet network, or other similar type of network environment. The network 965 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 901 is a PC, workstation, intelligent device or the like, the software in the memory 910 may further include a basic input output system (BIOS) (omitted for simplicity). The BIOS is a set of essential software routines that initialize and test hardware at startup, start the OS 911, and support the transfer of data among the hardware devices. The BIOS is stored in ROM so that the BIOS can be executed when the computer 901 is activated.

When the computer 901 is in operation, the processor 905 is configured to execute software stored within the memory 910, to communicate data to and from the memory 910, and to generally control operations of the computer 901 pursuant to the software. The checksum calculation and validation methods described herein and the OS 911, in whole or in part, but typically the latter, are read by the processor 905, perhaps buffered within the processor 905, and then executed.

When the systems and methods described herein are implemented in software, as is shown in FIG. 9, the methods can be stored on any computer readable medium, such as storage 920, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In exemplary embodiments, where the checksum calculation and validation methods are implemented in hardware, the checksum calculation and validation methods described herein can implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A computer program product including a non-transitory computer readable medium storing instructions for causing a computer to implement a checksum calculation, prediction and validation method, the method comprising:
   receiving a portion of a data packet in a data buffer, the portion of the data packet including all data headers of the data packet and a subset of all data of the data packet;
   computing information related to the checksum of the data headers via a first engine of the data packet based on the portion of the data packet;
   computing an expected full checksum of all data in the data packet; and
   processing the data packet in a processor,
   wherein the data packet is received in a reception data buffer, and
   wherein an actual checksum of the data packet is received in the reception data buffer.

2. The computer program product as claimed in claim 1 wherein the portion of the data packet is a data header.

3. The computer program product as claimed in claim 2 wherein the information related to the checksum of the data packet is the expected full checksum of the data packet.

4. The computer program product as claimed in claim 1 wherein processing the data packet comprises validating the data packet by comparing the expected full checksum of the data packet and the actual full checksum of the data packet.

5. A computer program product including a non-transitory computer readable medium storing instructions for causing a computer to implement a checksum calculation, prediction and validation method, the method comprising:
   receiving a portion of a data packet in a data buffer, the portion of the data packet including all data headers of the data packet and a subset of all data of the data packet;
   computing information related to the checksum of the data headers via a first engine of the data packet based on the portion of the data packet;
   computing an expected full checksum of all data in the data packet; and
   processing the data packet in a processor,
   wherein the data packet is received in a transmission data buffer, and
   wherein an actual checksum of the data packet is received in the transmission data buffer.

6. The computer program product as claimed in claim 5 wherein the portion of the data packet is a data header.

7. The computer program product as claimed in claim 6 wherein the information related to the checksum of the data packet is computed checksum factors of the data packet.

8. The computer program product as claimed in claim 7 wherein the method further comprises:

subtracting irrelevant factors from the data packet.

9. The computer program product as claimed in claim 8 wherein processing the data packet comprises inserting the actual checksum into the data packet for transmission.

\* \* \* \* \*